(12) United States Patent
Best et al.

(10) Patent No.: US 6,914,664 B2
(45) Date of Patent: Jul. 5, 2005

(54) LITHOGRAPHIC APPARATUS, ALIGNMENT METHOD AND DEVICE MANUFACTURING METHOD

(75) Inventors: Keith Frank Best, Prunedale, CA (US); Alexander Friz, San Jose, CA (US); Joseph J. Consolini, Costa Mesa, CA (US); Henricus Wilhelmus Maria Van Buel, Eindhoven (NL); Cheng-Qun Gui, Best (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/365,603

(22) Filed: Feb. 13, 2003

(65) Prior Publication Data

US 2003/0227604 A1 Dec. 11, 2003

(30) Foreign Application Priority Data

Feb. 15, 2002 (EP) .............................. 02251030

(51) Int. Cl.⁷ .......................... G03B 27/42; G01B 11/00
(52) U.S. Cl. .......................... 355/53; 356/400; 356/401
(58) Field of Search .................... 355/53, 77; 356/399, 356/400, 401; 250/492.1, 492.2

(56) References Cited

U.S. PATENT DOCUMENTS

| | | | | |
|---|---|---|---|---|
| 4,758,864 A | | 7/1988 | Endo et al. | |
| 5,440,138 A | * | 8/1995 | Nishi | 250/548 |
| 5,796,483 A | * | 8/1998 | Nakayama | 356/490 |
| 5,950,093 A | * | 9/1999 | Wei | 438/401 |
| 6,093,618 A | * | 7/2000 | Chen et al. | 438/400 |
| 6,417,922 B1 | * | 7/2002 | Dirksen et al. | 356/401 |

FOREIGN PATENT DOCUMENTS

| | | |
|---|---|---|
| EP | 1 148 390 A2 | 10/2001 |
| EP | 1 223 469 A1 | 7/2002 |

OTHER PUBLICATIONS

Wong et al., "Experimental and Simulation Studies of Alignment Marks," *SPIE Optical/Laser Microlithography IV*, 1463:315–323 (1991) (Abstract No. XP–000988982).

* cited by examiner

*Primary Examiner*—Alan Mathews
(74) *Attorney, Agent, or Firm*—Pillsbury Winthrop LLP

(57) ABSTRACT

To align between layers having a large Z separation, an alignment system which illuminates reference markers with normally incident radiation is used. The alignment system has an illumination system that is telecentric on the substrate side.

25 Claims, 4 Drawing Sheets

A    B    C

LITHOGRAPHIC APPARATUS, ALIGNMENT METHOD AND DEVICE MANUFACTURING METHOD

RELATED APPLICATION

This application claims the benefit of priority to European Patent Application No. 02251030.9, filed Feb. 15, 2002, the contents of which are herein incorporated by reference.

BACKGROUND OF THE INVENTION

1. Field of the Invention

The present invention relates to a lithographic apparatus, an alignment method and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

In manufacture of a device using the lithographic process, it is generally necessary to perform a large number of exposures on a single substrate to create the numerous layers required to form the device. In this process it is essential that the subsequent exposures are correctly positioned relative to the previously performed exposures. Deviations from correct alignment between layers are referred to as overlay errors. To avoid overlay errors, prior to an exposure the substrate must be correctly aligned in the lithographic apparatus. Two types of alignment devices are known. A through-the-lens (TTL) type of alignment device illuminates alignment markers provided on the substrate in the form of gratings with laser light. The diffracted light is collected by the lens of the lithographic apparatus and directed onto corresponding alignment marks, usually in the form of phase gratings, provided on the mask. A detector is placed behind the mask marker and the intensity of the radiation passing through the mask marker is monitored as the wafer is scanned underneath the projection lens. A maximum in the output from the detector indicates the correct aligned position. The correct aligned position effectively provides a zero-reference for an interferometric displacement measuring device which is used to control subsequent movement of the stage. In a known off-axis type alignment device, an alignment tool at a measuring station is used to measure the positional relationship between a plurality of alignment markers provided on the substrate and one or more reference markers fixedly mounted to the substrate stage. When the substrate stage, carrying the substrate, is transferred to the exposure station, the fixed reference marker provided on the substrate stage is aligned to a marker in the mask and thereby the positional relationship between the mask image and the substrate can be derived.

The known alignment tools and processes function adequately for production of semiconductor devices where the vertical difference between layers is not too large. However, the known alignment tools and techniques are not capable of performing alignments to alignment marks with large vertical separations so that to align later process layers to zero marks etched into the bare substrate, it has been necessary to form a series of alignments between alignment markers at intermediate vertical positions. This has the disadvantage that measurement errors may accumulate in the course of carrying out several alignments. Further problems arise in the manufacture of micro electromechanical systems (MEMS) and micro-opto-electromechanical systems (MOEMS) in which layer thicknesses are considerably greater than in the manufacture of semiconductor devices. With large layer thicknesses as occur in the manufacture of MEMS and MOEMS, it may not be possible to perform an alignment between vertically separated alignment markers using intermediate markers.

SUMMARY OF THE INVENTION

It is an aspect of the present invention to provide an alignment process and lithographic apparatus having an alignment tool capable of performing an alignment between markers having a large vertical separation.

This and other aspects are achieved according to the invention in a lithographic apparatus including a radiation system constructed and arranged to provide a projection beam of radiation; a support structure constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; and an alignment system constructed and arranged to detect alignment between a reference mark and an alignment mark provided on the substrate, the alignment system comprising an optical system constructed and arranged to illuminate the alignment mark with an alignment beam, wherein the optical system is adapted to direct the alignment beam so as to be substantially normal to the substrate on the alignment mark.

By ensuring the alignment beam is normally incident on the alignment mark, a correct alignment reading can be obtained at any vertical position allowing direct alignment between marks in layers having a large vertical separation, e.g. greater than 10 $\mu$m. By ensuring that the angle of incidence of the alignment beam is <0.5 mrad, alignment over vertical separations up to 300–500 $\mu$m, for example, can be achieved. With additional linear or quadratic corrections, or an angle of incidence of the alignment beam <0.25 mrad, alignment over vertical separations up to 700 $\mu$m or even 1 mm can be achieved.

The present invention also provides a method of alignment to first and second alignment marks provided on respective first and second layers in a device formed on a substrate, the first and second layers having a large separation in the direction normal to the substrate, and the second layer having been formed after the first layer, the method including deep trench etching layers of the device covering the first layer to reveal the first alignment mark; performing an alignment to the first alignment mark using an alignment system that illuminates the first alignment mark with an alignment beam that is substantially normal to the substrate; and performing an alignment to the second alignment mark using the alignment system.

According to a further aspect of the invention there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material, wherein prior to the step of projecting, an alignment process according to the method described above is carried out Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, micro-electro-mechanical systems (MEMS), micro-opto-electro-mechanical systems (MOEMS), gene chips, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
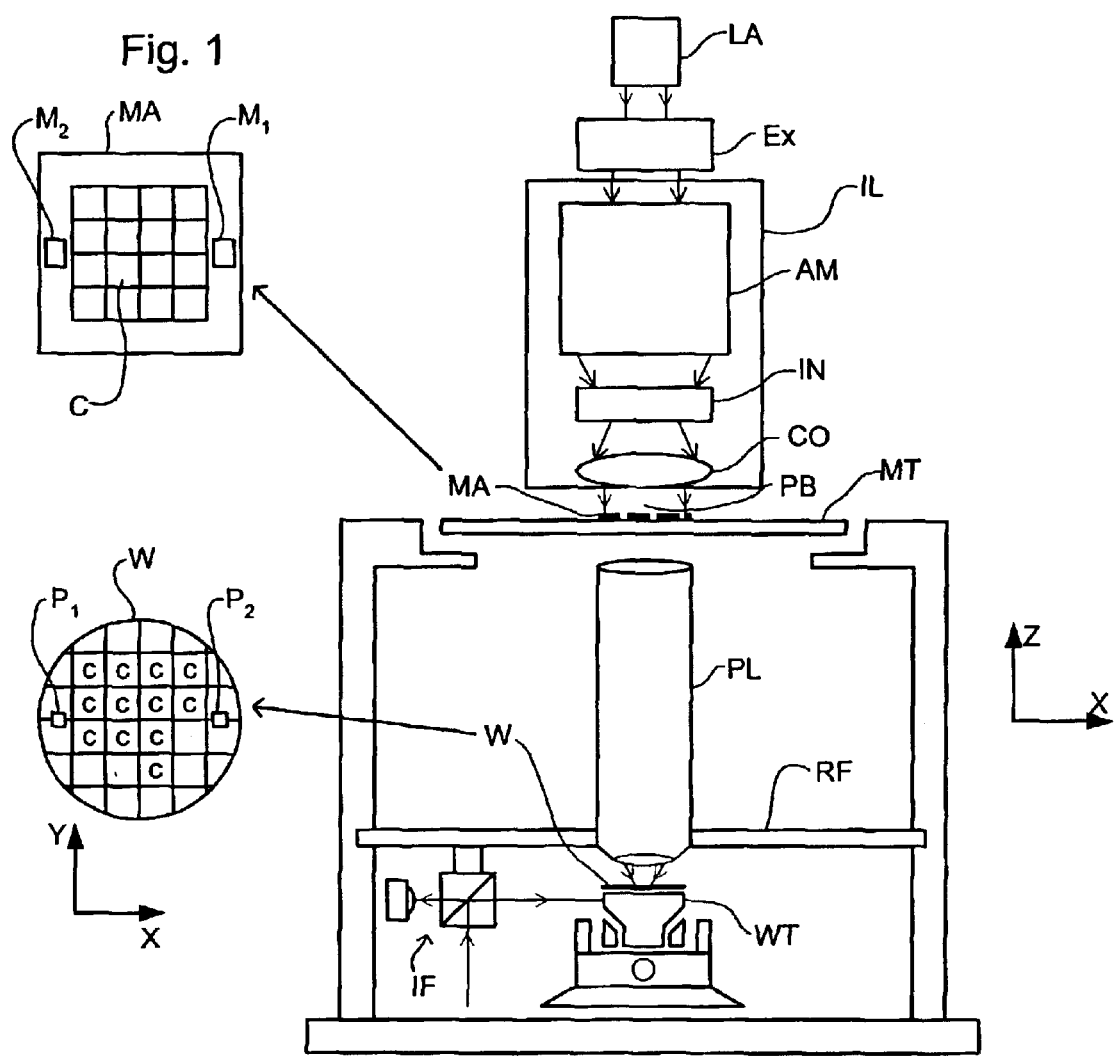
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device (not shown) to accurately position the mask with respect to a projection system or lens PL; a second object (substrate) table WT provided with a substrate holder constructed and arranged to hold a substrate W (e.g. a resist-coated silicon wafer), and connected to a second positioning device (not shown) to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF.

As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device and interferometric displacement measuring system IF, the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
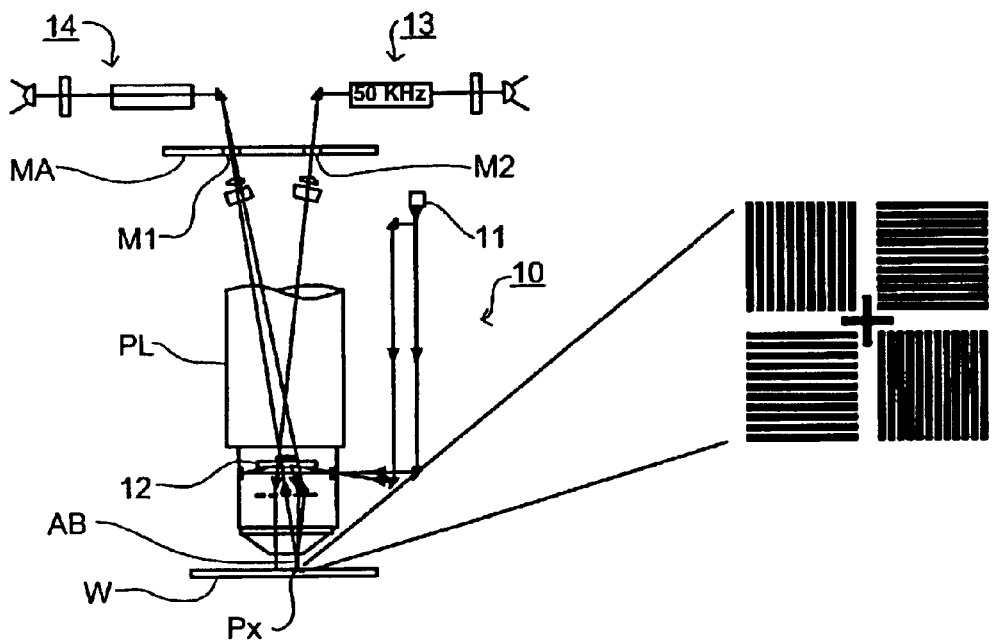
FIG. 2 is a simplified diagram of the alignment system included in the lithographic projection apparatus of FIG. 1.

A simplified schematic of the alignment system 10 and the form of the substrate alignment mark Px is shown in FIG. 2. The alignment system 10 comprises a 633 nm laser 11 whose light is projected through the lens PL onto the substrate W to illuminate the substrate alignment mark Px. As shown in the enlargement, substrate alignment mark Px consists of four gratings. Two grating are of 16 μm pitch and two gratings are of 17.6 μm pitch, with one of each type aligned with each stage coordinate axis (X, Y). The $1^{st}$-order reflected light from the substrate alignment mark Px is collected by the lens PL and focused on to a complimentary mark Mx of similar structure on the mask MA. It will be appreciated that there will be multiple substrate and mask marks which may be denoted by a numeral replacing the x in Px and Mx. The interference signal created by the $1^{st}$-order reflected light from the substrate marks Px interfering with the mask marks Mx creates an interference signal that is filtered and subsequently detected in detection branches 13, 14. A filter 12 is provided in the lens PL to select only the $1^{st}$-order diffracted beams.

Figure 3:
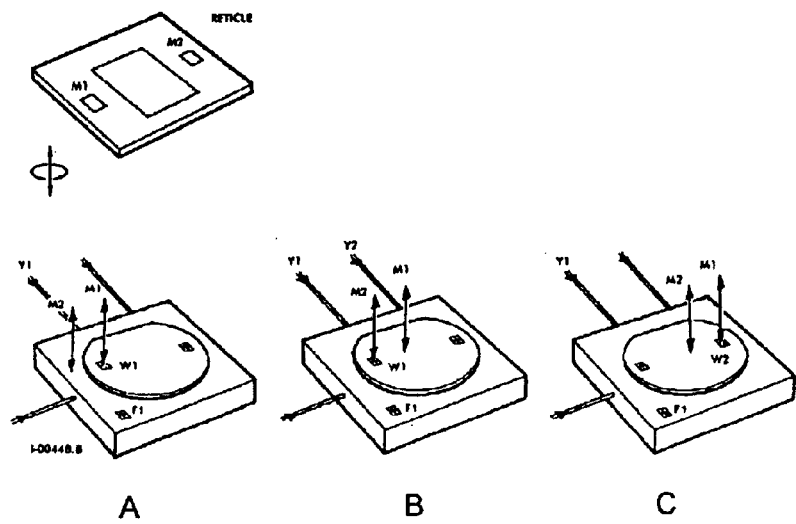
FIG. 3 illustrates three steps in the alignment process.

In an alignment procedure using this alignment system 10, the substrate W is placed on the substrate table WT and undergoes a mechanical and optical pre-alignment on a pre-alignment unit which is not relevant to the present invention and therefore not described further herein. The pre-alignment effects only a coarse alignment and therefore a fine alignment must also be performed, the procedure for which is illustrated in FIG. 3. FIG. 3 shows the mask MA carrying alignment markers M1 and M2, substrate W carrying alignment markers W1 and W2 as well as the substrate table WT carrying alignment marker F1. (sometimes referred to as a fiducial). Initially, the interferometric displacement measuring system IF is zeroed by aligning the fiducial F1 to mask marks M1, M2 in the mask. Next, a total alignment process is carried out by aligning substrate mark W1 to mask marks M1 and M2 and substrate mark W2 to mask mark M1. The first two steps allow determination of the mask rotation and lens magnification. The substrate W and the mask MA are then fully aligned by aligning substrate mark W1 to mask mark M1, substrate mark W2 to mask mark M1, substrate mark W1 to mask mark M1, and substrate mark W1 to mask mark M2. After these alignments, the substrate W is exposed with no further alignments necessary.

Figure 4:
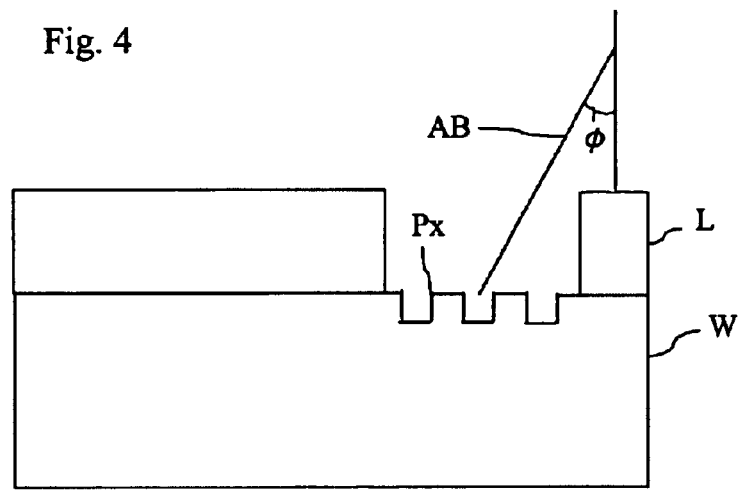
FIG. 4 illustrates the origin of telecentricity errors in a non-telecentric alignment tool.

In order to enable accurate alignments to be carried out at substantially differing Z-positions, the alignment beam AB leaving the projection system PL is arranged to be telecentric. The effect if this requirement is not met is shown in FIG. 4 where it can be seen that if the alignment beam AB is not orthogonal to the bottom of the lens PL at its exit from the lens PL, and hence makes an angle φ to the normal to the substrate W, then there will be a positional error in aligning to a deeply-recessed substrate mark Px, e.g. provided in the substrate W beneath a trench in a subsequent process layer L. This error is proportional to sin(φ) and the depth of the alignment mark Px. Accordingly, the illumination part of the alignment system 10 is arranged to illuminate the alignment mark Px at normal incidence, whatever the Z position of the alignment grating Px. This can be achieved by making the illumination part of the alignment system 10 telecentric, as seen from the substrate W. The illumination part of the alignment system 10 can be made telecentric by introduction of one or more plane plates in the path of the alignment beam AB. The thickness, wedge angle, and orientation of the plane plate(s) are adjusted until the desired angle of incidence is achieved. Preferably, two plane plates are used, one to adjust the angle of incidence and one the X, Y offset of the alignment system 10. In this way, the angle of incidence of the alignment beam AB can be adjusted to be less than 0.5 mrad or 0.25 mrad.

Figure 5:
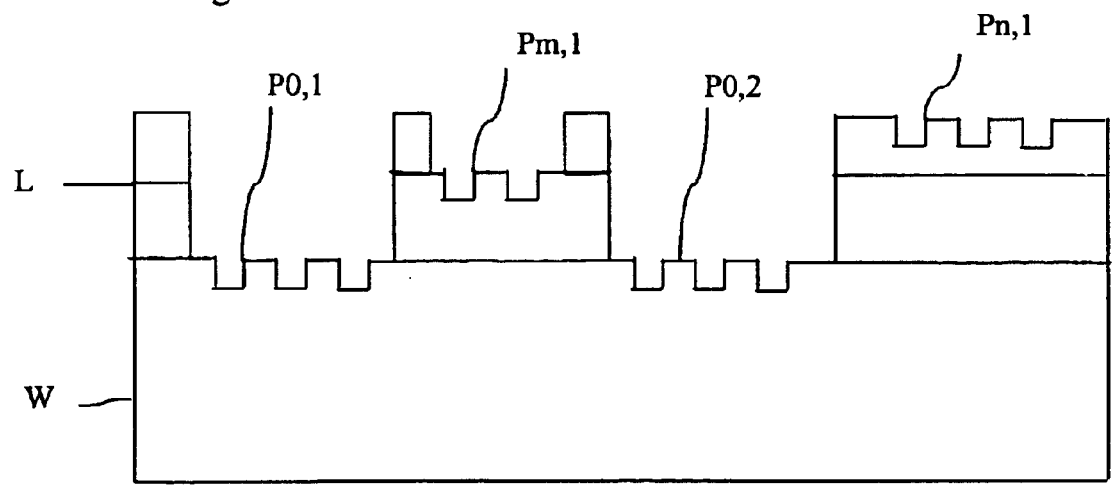
FIG. 5 illustrates high-level and recessed alignment marks which are aligned to in the method according to the present invention.

As shown in FIG. 5, after formation of process layer(s) L on top of substrate W, trenches are etched to reveal zero-layer marks P0,1 and P0,2 etched into the substrate W. These, and marks Pm,1 and Pn,1 provided on the mth and nth process layers, can then be aligned to by the alignment system 10 of the invention.

Figure 6:
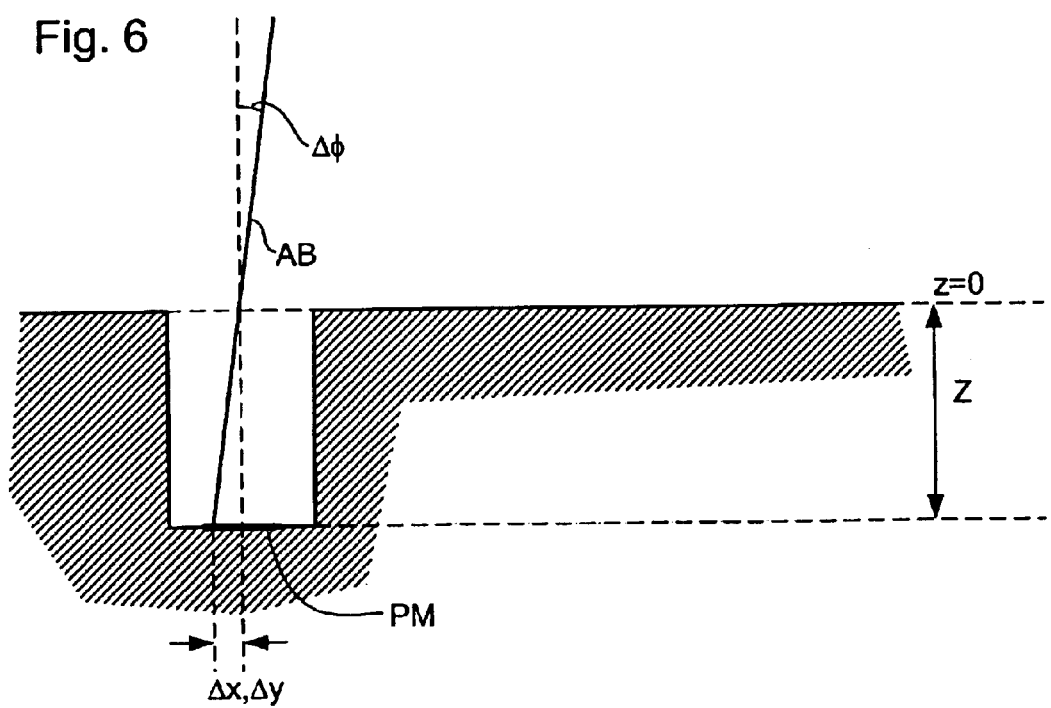
FIG. 6 illustrates the effect of telecentricity errors in a non-telecentric alignment tool.

In addition to minimizing the alignment beam angle of incidence, as described above, the performance of the alignment system 10 can be further improved by use of a software correction based on empirical data from calibration. As shown in FIG. 6, an angle of incidence Δφ results in a measured position of a recessed mark PM offset from its frame position by amount Δx, Δy. Using a calibration substrate, the offsets are measured for a plurality of different vertical (Z) positions. This data is then used to determine the coefficients of a model.

A simple, linear model may take the form:

$$\Delta x = az + b$$

$$\Delta y = cz + b.$$

Greater accuracy can be achieved using a quadratic model of the form:

$$\Delta x = az^2 + cz + b$$

$$\Delta y = dz^2 + ez + b.$$

Where the position marker is of a type having two gratings of different period for each direction, X and Y, it may also be necessary to take into account the effect of magnification changes with vertical position in the alignment system on the apparent separation of the two gratings. This can be achieved using a model of the form:

$$\Delta \text{shift-}x = f \cdot Z \cdot \text{shift-}x$$

$$\Delta \text{shift-}y = g \cdot Z \cdot \text{shift-}y$$

where f and g are machine or machine-type dependent constants.

When the coefficients for a given machine have been determined, the alignment results are corrected using the Δx, Δy values calculated for each alignment on the basis of the vertical position of the marker.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a beam of radiation;
   a support structure constructed and arranged to support a patterning device, the patterning device constructed and arranged to pattern the beam according to a desired pattern;

a substrate table constructed and arranged to hold a substrate;

a projection system constructed and arranged to project the patterned beam onto a target portion of the substrate; and an alignment system constructed and arranged to detect alignment between a reference mark and an alignment mark provided on the substrate, the alignment system comprising an optical system constructed and arranged to illuminate the alignment mark with an alignment beam, wherein the optical system is adapted to direct the alignment beam so as to be substantially normal to the substrate on the alignment mark.

2. An apparatus according to claim 1, wherein the optical system is substantially telecentric on the substrate side.

3. An apparatus according to claim 1, wherein the alignment beam has an angle of incidence to the normal to the substrate of less than 0.5 mrad.

4. An apparatus according to claim 1, wherein the alignment beam has an angle of incidence to the normal to the substrate of less than 0.25 mrad.

5. An apparatus according to claim 1, wherein the optical system directs light onto the alignment mark via at least part of the projection system.

6. An apparatus according to claim 1, wherein the reference mark is provided on one of the support and the patterning device and light from the alignment mark is directed onto the reference mark via the projection system.

7. An apparatus according to claim 1, wherein the optical system is adapted to direct the alignment beam with an incidence angle lower than 0.5 mrad relative to a direction normal to the substrate.

8. An apparatus according to claim 1, wherein the alignment system is configured to minimize the alignment beam angle of incidence relative to a direction normal to the substrate by using a mathematical model based on empirical data from calibration.

9. An apparatus according to claim 8, wherein the mathematical model is one of a linear model and a quadratic model.

10. An apparatus according to claim 1, wherein the optical system, which is adapted to direct the alignment beam so as to be substantially normal to the substrate on the alignment mark, comprises one or more plane plates.

11. An apparatus according to claim 10, wherein an angle of incidence of the alignment beam to the normal to the substrate is adjusted by modifying one of a thickness, wedge angle, orientation or a combination thereof of the one or more plane plates.

12. A method of alignment to first and second alignment marks provided on respective first and second layers in a device formed on a substrate, the first and second layers having a large separation in the direction normal to the substrate, and the second layer having been formed after the first layer, the method comprising:

etching layers of the device covering the first layer to reveal the first alignment mark;

performing an alignment to the first alignment mark using an alignment system that illuminates the first alignment mark with an alignment beam that is substantially normal to the substrate; and performing an alignment to the second alignment mark using the alignment system.

13. A method according to claim 12, further comprising etching the second mark in the second layer prior to etching layers of the device covering the first layer.

14. A method according to claim 12, wherein the first and second alignment marks are diffraction gratings.

15. A method according to claim 12, wherein the first layer is a substrate.

16. A method according to claim 12, wherein the first layer is a layer formed above the substrate.

17. A method according to claim 12, further comprising correcting the alignments using a model of positional offsets in directions parallel to a nominal surface of the substrate as a function of the position of the alignment marker in the direction perpendicular to the nominal surface.

18. A method according to claim 12, wherein the device is micro electro-mechanical device or a micro opto electro-mechanical device.

19. A method of alignment according to claim 12, wherein a distance separating the first alignment mark from the second alignment mark along the direction normal to the substrate is greater than 10 $\mu$m.

20. A method of alignment according to claim 12, wherein performing an alignment to the first alignment mark comprises illuminating the first alignment mark with an alignment beam having an incidence angle lower than 0.5 mrad relative to the direction normal to the substrate.

21. A method of alignment according to claim 12, wherein etching layers of the device covering the first layer comprises deep trench etching.

22. A device manufacturing method, comprising:

providing a substrate that is at least partially covered by a layer of radiation-sensitive material;

providing a projection beam of radiation using a radiation system;

using a patterning device to endow the projection beam with a pattern in its cross-section; and projecting the patterned beam of radiation onto a target portion of the layer of radiation-sensitive material, wherein prior to projecting, an alignment process according to the method of claim 12 is carried out.

23. A method of alignment to first and second alignment marks provided respectively on a substrate and on a layer of material formed on the substrate, the first and second alignment marks having a large separation in the direction normal to the substrate, the method comprising:

etching layers of materials covering the substrate to reveal the first alignment mark;

performing an alignment to the first alignment mark using an alignment system that illuminates the first alignment mark with an alignment beam that is substantially normal to the substrate; and performing an alignment to the second alignment mark using the alignment system.

24. A method of alignment according to claim 23, wherein a distance separating the first alignment mark from the second alignment mark along the direction normal to the substrate is greater than 10 $\mu$m.

25. A method of alignment according to claim 23, wherein performing an alignment to the first alignment mark comprises illuminating the first alignment mark with an alignment beam having an incidence angle lower than 0.5 mrad relative to the direction normal to the substrate.

* * * * *